US012621972B2

(12) United States Patent
Cha et al.

(10) Patent No.: US 12,621,972 B2
(45) Date of Patent: May 5, 2026

(54) ELECTRONIC DEVICE, AND DISASSEMBLING DEVICE FOR DISASSEMBLING SAME

(71) Applicants: HUMAX CO., LTD., Yongin-si (KR); HUMAX NETWORKS, INC., Seongnam-si (KR)

(72) Inventors: Jong Ha Cha, Yongin-si (KR); Sang Kon Kwak, Seongnam-si (KR)

(73) Assignees: HUMAX CO., LTD., Yongin-si (KR); HUMAX NETWORKS, INC., Seongnam-si (KR)

( * ) Notice: Subject to any disclaimer, the term of this patent is extended or adjusted under 35 U.S.C. 154(b) by 605 days.

(21) Appl. No.: 18/247,100

(22) PCT Filed: Sep. 28, 2021

(86) PCT No.: PCT/KR2021/013190

§ 371 (c)(1),
(2) Date: Mar. 29, 2023

(87) PCT Pub. No.: WO2022/071711

PCT Pub. Date: Apr. 7, 2022

(65) Prior Publication Data

US 2023/0380125 A1 Nov. 23, 2023

(30) Foreign Application Priority Data

Sep. 29, 2020 (KR) ........................ 10-2020-0126905
Jun. 17, 2021 (KR) ........................ 10-2021-0078937

(51) Int. Cl.
H05K 13/04 (2006.01)
H05K 5/02 (2006.01)
H05K 5/10 (2025.01)

(52) U.S. Cl.
CPC ....... *H05K 13/0486* (2013.01); *H05K 5/0217* (2013.01); *H05K 5/10* (2025.01)

(58) Field of Classification Search
CPC ...... H05K 5/0208; H05K 5/0217; H05K 5/10; H05K 5/15; H05K 13/0486;
(Continued)

(56) References Cited

U.S. PATENT DOCUMENTS 7,944,690 B2    5/2011 Yamagiwa
8,752,911 B2 *  6/2014 Dernier .................... H05K 5/15
                                             361/679.01
(Continued)

FOREIGN PATENT DOCUMENTS

JP    2000-013958 A    1/2000
JP    2009-176937 A    8/2009
(Continued)

OTHER PUBLICATIONS

International Search Report and Written Opinion of the International Searching Authority of PCT/KR2021/013190, dated Jan. 4, 2022.

*Primary Examiner* — Thomas J Hong
*Assistant Examiner* — Joshua D Anderson

(57) ABSTRACT

A disassembling device according to the present invention comprises: a base unit including a base block; a moving unit provided such that an electronic device formed from the coupling of an upper housing and a lower housing is loaded therein, arranged to be upwardly spaced from the base block, and coupled to the base unit to enable relative movement with respect to the base block; a fixing unit moving in conjunction with the movement of the moving unit to detach, from the moving unit, the lower housing loaded in the moving unit; and a separation unit inserted into the
(Continued)

electronic device by means of the movement of the moving unit to separate the upper housing from the lower housing.

9 Claims, 10 Drawing Sheets

(58) Field of Classification Search
CPC ........ H05K 2203/176; Y10T 29/43274; Y10T 29/49815; Y10T 29/49822; Y10T 29/49824; Y10T 29/53274; B23P 19/02; B23P 19/025
See application file for complete search history.

(56) References Cited

U.S. PATENT DOCUMENTS

| | | | | |
|---|---|---|---|---|
| 9,549,474 B2* | 1/2017 | Hu | ........................... | H05K 5/03 |
| 9,717,153 B2* | 7/2017 | Dernier | ................... | H05K 5/15 |
| 2009/0190291 A1 | 7/2009 | Yamagiwa | | |
| 2009/0193651 A1* | 8/2009 | Chen | ....................... | B23P 19/04 |
| | | | | 29/762 |
| 2017/0354045 A1* | 12/2017 | Chen | ................... | H05K 5/0217 |

FOREIGN PATENT DOCUMENTS

| | | |
|---|---|---|
| KR | 20-2009-0006800 U | 7/2009 |
| KR | 10-1018384 B1 | 3/2011 |

* cited by examiner

REAR

LEFT

UP

FRONT

RIGHT

DOWN

ELECTRONIC DEVICE, AND DISASSEMBLING DEVICE FOR DISASSEMBLING SAME

CROSS-REFERENCE TO RELATED APPLICATIONS

This application is a National Stage Entry of PCT International Application No. PCT/KR2021/013190, which was filed on Sep. 28, 2021, and which claims priority from and the benefit of Korean Patent Application 10-2020-0126905, filed with the Korean Intellectual Property Office on Sep. 29, 2020 and Korean Patent Application 10-2021-0078937, filed with the Korean Intellectual Property Office on Jun. 17, 2021, the disclosure of which are hereby incorporated by reference in its entirety.

TECHNICAL FIELD

The present disclosure relates to an electronic device and a disassembling apparatus for disassembling the same.

BACKGROUND ART

An electronic device, such as a set-top box, generally includes a housing for protecting a board, in which parts are electrically connected to each other. A structure for fixing the board is formed in the housing, and the board may be distinguished and protected from an outside in a scheme, in which different parts of the housing are coupled to each other in a state, in which the board is embedded.

A plurality of coupling tools, such as screws, may be used for coupling of the housing, and thus, a process of removing the coupling tools and an excessive disassembling process are necessary for approach to the board and the parts in an interior of the electronic device. Here, the excessive disassembling process means a disassembling process when the housing and the board may be disassembled only through a complex process instead of being disassembled conveniently.

When the electronic device has to be disassembled through the excessive disassembling process, a possibility of damage to internal parts increases. Furthermore, screw threads may be worn due to the repeated coupling and disassembling of the coupling tools.

DISCLOSURE

Technical Problem

An aspect of the present disclosure provides an electronic device that may be easily assembled or disassembled, and a disassembling apparatus that may easily disassemble the electronic device.

Technical Solution

According to an aspect of the present disclosure, a disassembling apparatus includes a base part including a base block, a movable part that is configured such that an electronic device, in which an upper housing and a lower housing are coupled to each other, is disposed to be spaced upwards apart from the base block, and is coupled to the base part to be moved relative to the base block, a fixing part moved in conjunction with movement of the movable part and that attaches or detaches the lower housing seated on the movable part to or from the movable part, and a separation part inserted into an interior of the electronic device through movement of the movable part, and that separates the upper housing and the lower housing.

According to another aspect of the present disclosure, an electronic device includes a lower housing including a lower coupling part and a fixing opening that is opened along an upward/downward direction such that a fixing member of a disassembling apparatus is inserted thereinto to be stopped, and an upper housing including an upper coupling part inserted downwards into and coupled to the lower coupling part through snap-fitting, and coupled to the lower housing from an upper side of the lower housing, and the lower coupling part includes a coupling opening opened along the upward/downward direction such that the upper coupling part is exposed to a lower side, and a lower stopper step covering a portion of the coupling opening such that the upper coupling part is stopped thereby.

Advantageous Effects

Accordingly, the electronic device may be easily disassembled by using the disassembling apparatus.

MODE FOR INVENTION

Figure 1:
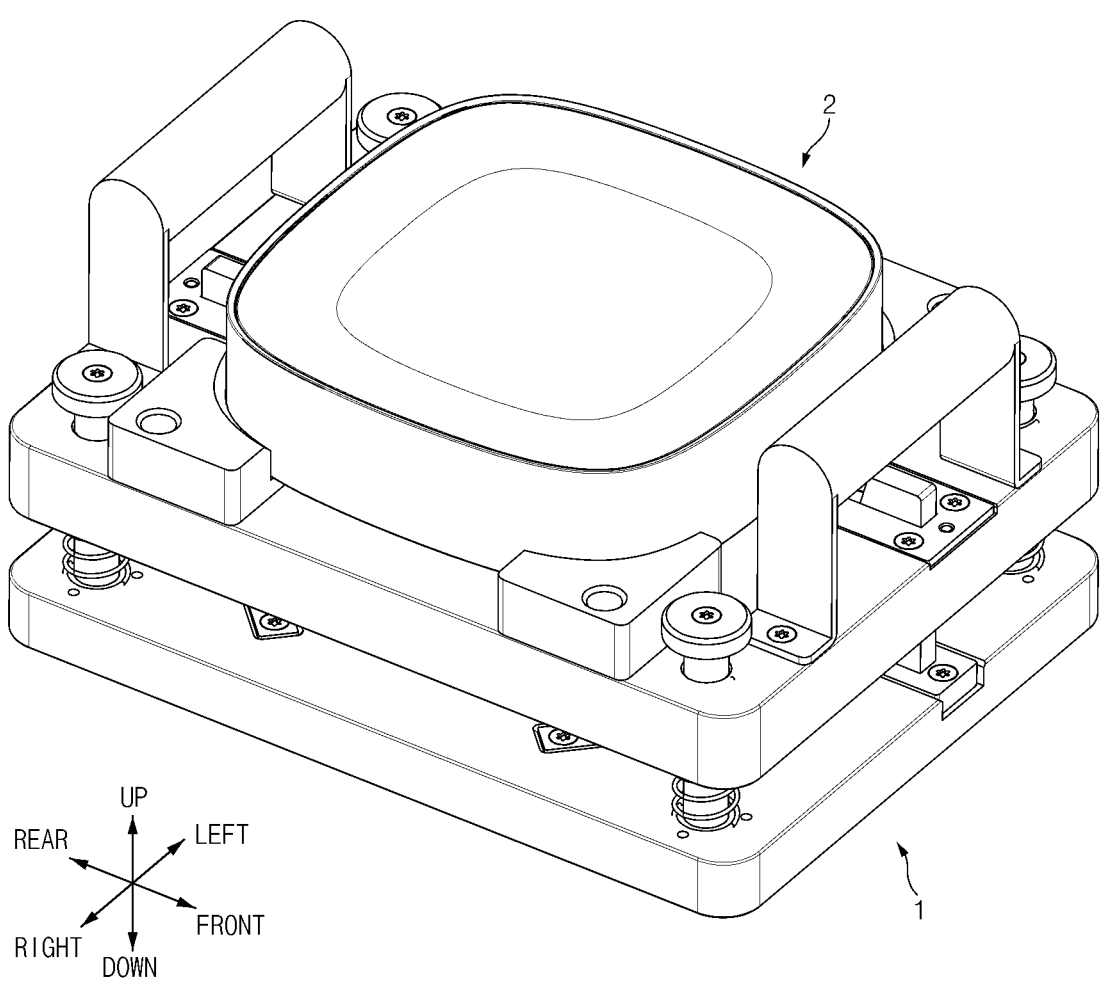
FIG. 1 is a perspective view illustrating a state, in which an electronic device is seated on a disassembling apparatus according to an embodiment of the present disclosure.

Hereinafter, some embodiments of the present disclosure will be described in detail with reference to the exemplary drawings. Throughout the specification, it is noted that the same or like reference numerals denote the same or like components even though they are provided in different drawings. Further, in the following description of the present disclosure, a detailed description of known functions and configurations incorporated herein will be omitted when it may make the subject matter of the present disclosure rather unclear.

The terms, such as first, second, A, B, (a), (b) or the like may be used herein when describing components of the present disclosure. The terms are provided only to distinguish the components from other components, and the essences, sequences, orders, and the like of the components are not limited by the terms. When it is described that a component is "connected to", "coupled to", or "electrically connected to" another component, it should be understood that the component may be directly connected to the another component but a third component may be "connected to", "coupled to" or "electrically connected to" the components, between the components.

FIG. 1 is a perspective view illustrating a state, in which an electronic device 2 is seated on a disassembling apparatus 1 according to an embodiment of the present disclosure.

Referring to the drawing, the electronic device 2 according to an embodiment of the present disclosure may be seated on the disassembling apparatus 1, and may be conveniently disassembled through manipulation of the disassembling apparatus 1 in a seated state thereof. In the specification of the present disclosure, an upward/downward direction (UP and DOWN), a forward/rearward direction (FRONT and REAR), and a leftward/rightward direction (LEFT and RIGHT) are used for convenience of description, but the upward/downward direction may necessarily not mean a vertical direction depending on a direction, in which the electronic device 2 and the disassembling apparatus 1 are arranged.

Electronic Device 2

Figure 2:
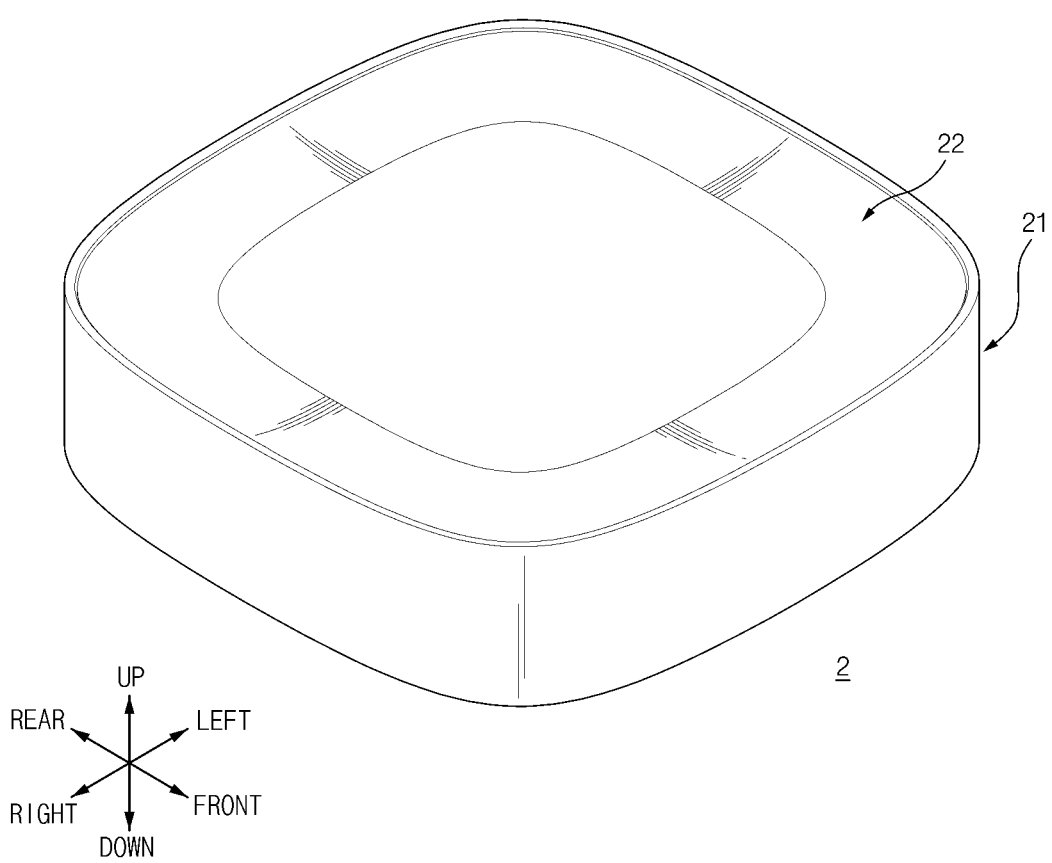
FIG. 2 is a perspective view of an electronic device according to an embodiment of the present disclosure.
Figure 3:
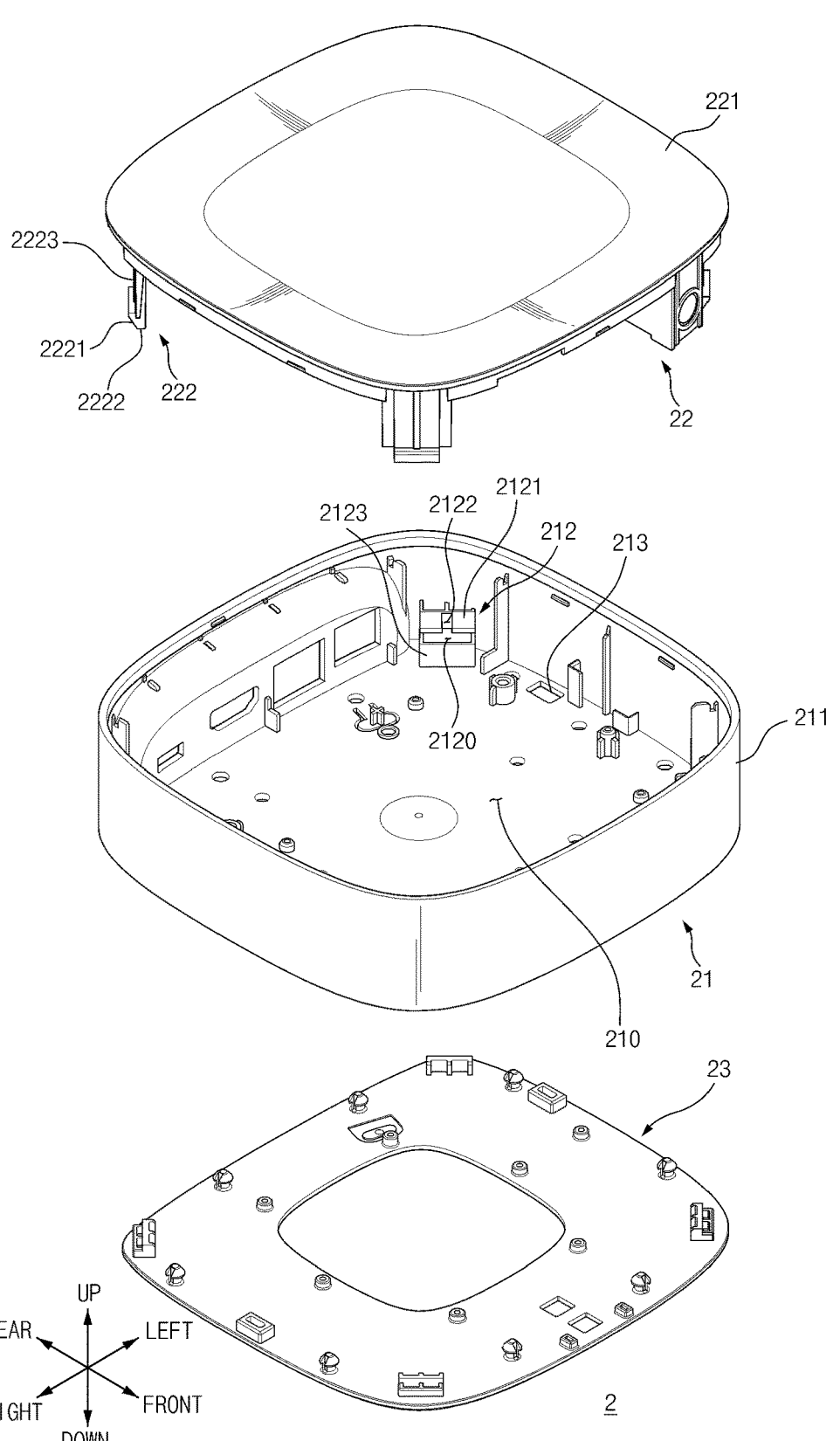
FIG. 3 is an exploded perspective view of an electronic device according to an embodiment of the present disclosure.

FIG. 2 is a perspective view of the electronic device 2 according to an embodiment of the present disclosure. FIG. 3 is an exploded perspective view of the electronic device 2 according to an embodiment of the present disclosure.

The electronic device 2 according to an embodiment of the present disclosure includes a lower housing 21 and an upper housing 22. The electronic device 2 may further include a rubber foot 23. When the electronic device 2 is seated on the disassembling apparatus 1, it may be seated after the rubber foot 23 is removed. The rubber foot 23 is a component that may be coupled to a lower surface of the lower housing 21. The rubber foot 23 may be formed of a material that may generate a strong frictional force against another surface, for example, of rubber. Furthermore, the rubber foot 23 may be formed of an elastic and insulating material, such as rubber. The rubber foot 23 may cover a fixing opening 213 formed in the lower housing 21 and the like from a lower side whereby holes, such as a coupling opening 2120 and the fixing opening 213, which are formed in the lower housing 21, may not be exposed to an outside. Furthermore, when the electronic device 2 is disposed to be seated at a location, it may be prevented from being easily separated from the corresponding location due to the frictional force of the rubber foot 23.

The electronic device 2 may include a board 24. The board 24 is a component that is formed by electrically connecting electronic parts, and may be configured to allow the electronic device 2 to perform a specific function. The board 24 may be embedded in the lower housing 21 and may be fixed to an interior structure of the lower housing 21. The electronic device 2 according to an embodiment of the present disclosure may be set-top box. Accordingly, the board 24 may be the board 24 that is provided to perform a function of the set-top box, and may be electrically connected to a communication line and a power line through a terminal disposed on a rear surface of the lower housing 21.

The upper housing 22 is a housing that constitutes an upper area of the housing of the electronic device 2. The upper housing 22 may be moved to a lower side while covering an opened upper surface of the lower housing 21 from an upper side of the lower housing 21 to be coupled to the lower housing 21. The upper housing 22 may surround an interior space 210 formed in the lower housing 21 such that the housing may have a box shape as a whole. The upper housing 22, as illustrated, may include an upper housing body 221 that has a plate shape and an upper coupling part 222 that protrudes downwards from the upper housing body 221.

The upper coupling part 222 may be disposed adjacent to four corners of the upper housing body 221, and a location thereof is not limited thereto. The upper coupling part 222 may be inserted downwards into a lower coupling part 212, and may be coupled thereto through snap-fitting. To be coupled through snap-fitting, the upper coupling part 222 may include an upper coupling body 2223 that extends downwards from the upper housing body 221, and an upper coupling head 2221, of which a cross-section obtained by cutting it along a plane that is perpendicular to the upward/downward direction decreases as it goes from a lower end of the upper coupling body 2223 to a lower side. Accordingly, the upper coupling head 2221 may have an outer surface that is inclined with respect to the upward/downward direction.

A cross-sectional area of an upper end of the upper coupling head 2221 may be formed to be larger than a cross-sectional area of the upper coupling body 2223, and thus a step may be formed between the upper end of the upper coupling head 2221 and the upper coupling body 2223. The lower coupling part 212 may be guided along an inclined surface of the upper coupling head 2221, and the snap-fitting may be achieved while the lower coupling part 212 is stopped by the above-described step.

A head surface 2222 may be formed at a lower end of the upper coupling head 2221. The head surface 2222 may be a flat surface that is perpendicular to the upward/downward direction.

The lower housing 21 is a housing that constitutes a lower area of the housing of the electronic device 2. The board 24 may be fixed to the lower housing 21. The lower housing 21 may have an opened upper surface to have a box shape having the interior space 210, and a lateral surface thereof may be a curved surface that is not angular, but a shape thereof is not limited thereto.

The lower housing 21 may include a lower housing body 211, and the lower coupling part 212 and the fixing opening 213, which are formed in the lower housing body 211. The fixing opening 213 is an opening, into which a fixing member 131 is inserted. The fixing opening 213 may be opened along the upward/downward direction. Accordingly, it may be identified that the fixing opening 213 is formed on a lower surface of the lower housing 21 when the lower housing 21 is viewed from a lower side to an upper side. Furthermore, the fixing member 131 may be inserted upwards into the fixing opening 213 from a lower side of the lower housing 21 and may be stopped by the lower housing 21. When viewed along the upward/downward direction, the fixing opening 213 may have a shape including a shape that is shown when the fixing member 131 is viewed along the upward/downward direction. Accordingly, the fixing member 131 may be inserted into the fixing opening 213 or may be separated to a lower side of the lower housing 21 through the fixing opening 213, and through horizontal movement of the fixing member 131, the fixing member 131 may be stopped by the lower housing 21.

Figure 4:
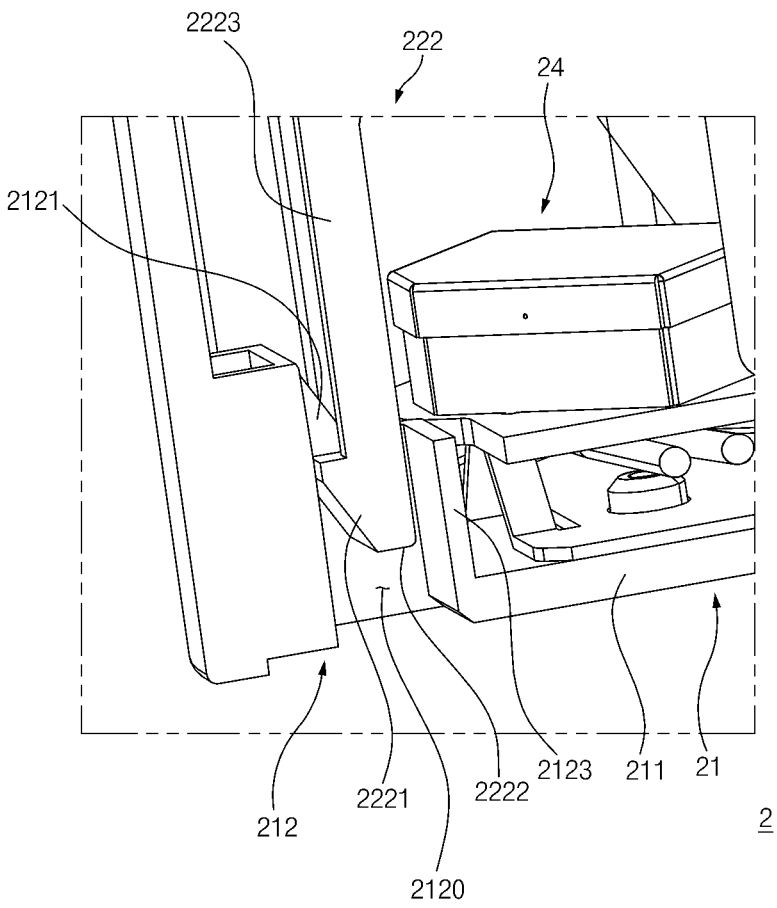
FIG. 4 is a view illustrating an electronic device after a portion thereof is cut away according to an embodiment of the present disclosure.
Figure 5:
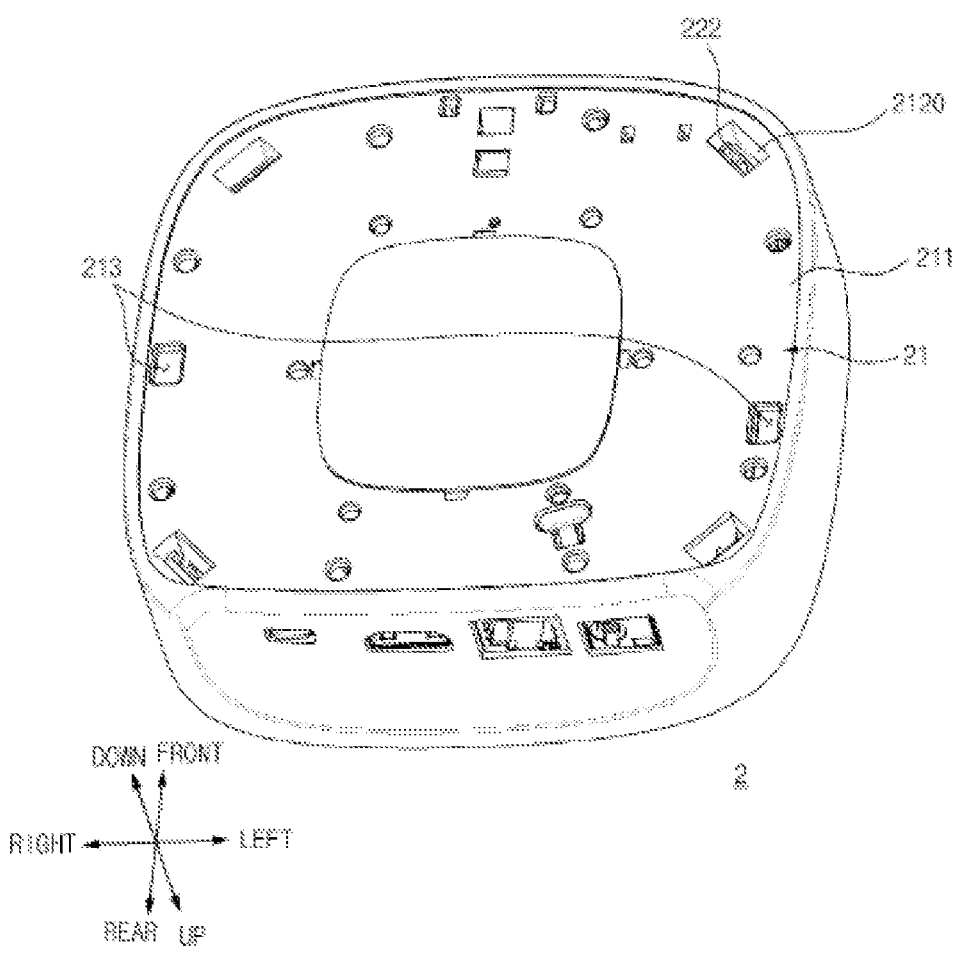
FIG. 5 is a perspective view of an electronic device according to an embodiment of the present disclosure, when viewed from a lower side.

FIG. 4 is a view illustrating the electronic device 2 after a portion thereof is cut away according to an embodiment of the present disclosure. FIG. 5 is a perspective view of the electronic device 2 according to an embodiment of the present disclosure, when viewed from a lower side.

The lower coupling part 212 may include the coupling opening 2120 and a lower stopper step 2121. The coupling opening 2120 is formed to be opened along the upward/downward direction such that the upper coupling part 222 coupled to the lower coupling part 212 is exposed to a lower side when there is no rubber foot 23. The lower coupling part 212 may include a lower coupling circumferential part 2123 that protrudes upwards from the lower housing body 211 and is defined by surrounding the coupling opening 2120.

The lower stopper step 2121 protrudes from an inner surface of the lower coupling circumferential part 2123 such that the upper coupling part 222 is stopped thereby to cover a portion of the coupling opening 2120. A step may be formed at a lower end of the lower stopper step 2121. That is, the upper coupling part 222 may be inserted into the coupling opening 2120, and may be stopped by the lower stopper step 2121 to be coupled.

The lower stopper step 2121 may guide insertion of the upper coupling part 222 into the coupling opening 2120 when being coupled to the upper coupling part 222 that is moved downwards. Accordingly, the lower stopper step 2121 may have an inclined outer surface that is inclined with respect to the upward/downward direction, which contacts the inclined outer surface of the upper coupling part 222. When the lower housing 21 and the upper housing 22 become closer, the outer surface of the lower stopper step 2121 and the outer surface of the upper coupling part 222, which have corresponding shapes, may contact each other and may be slid, and thus the upper coupling head 2221 may be guided to the coupling opening 2120. The upper coupling head 2221 may be inserted into the coupling opening 2120, and the step of the upper coupling head 2221 may be stopped by the step formed in the lower stopper step 2121.

A lower insertion hole 2122 may be formed in the lower stopper step 2121. The lower insertion hole 2122 may be formed by opening a center of the lower stopper step 2121 along the upward/downward direction. An inclined separation member 142 of a separation part 14, which will be described below, may be inserted into the lower insertion hole 2122.

Disassembling Apparatus 1—Base Part 11

Figure 6:
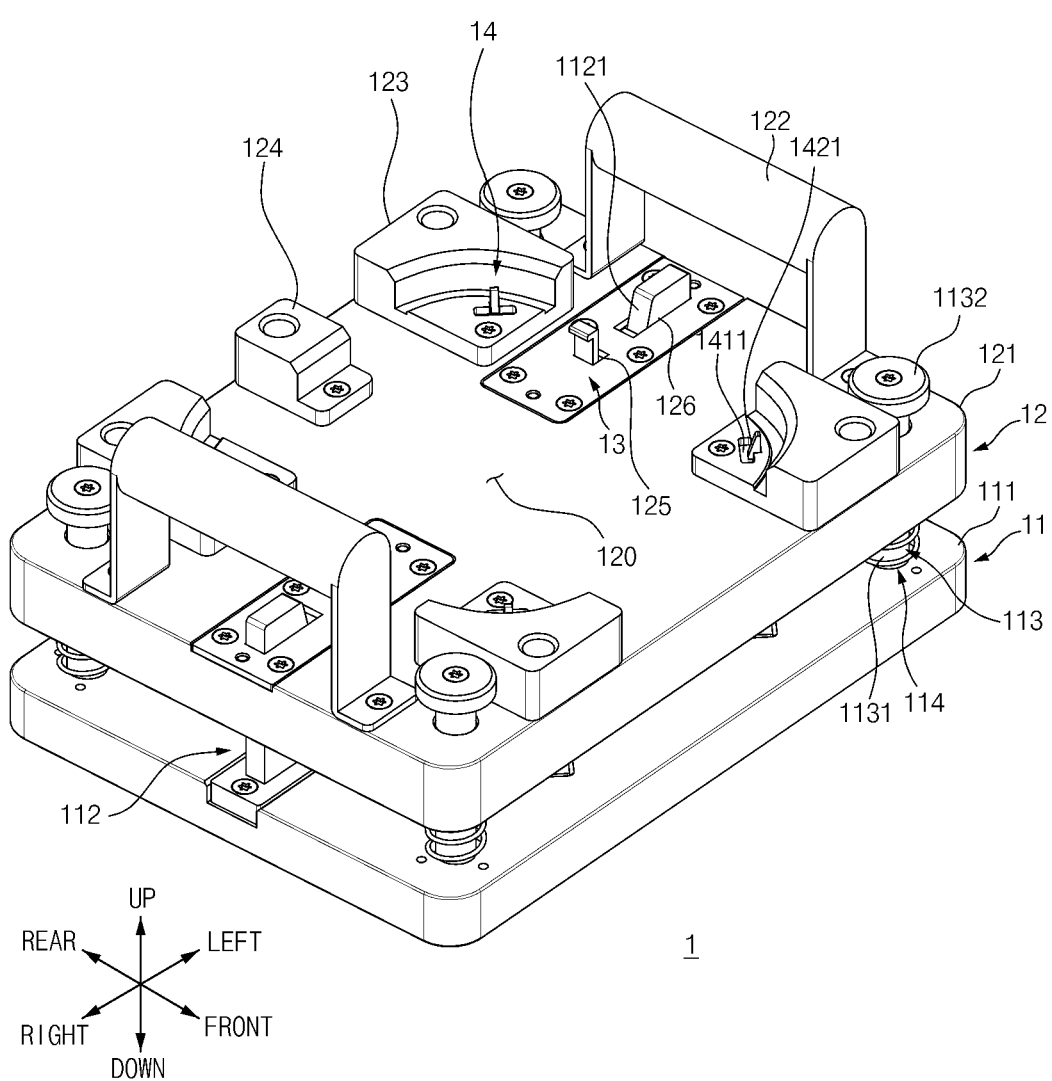
FIGS. 6 and 7 are perspective views of a disassembling apparatus according to an embodiment of the present disclosure.
Figure 7:
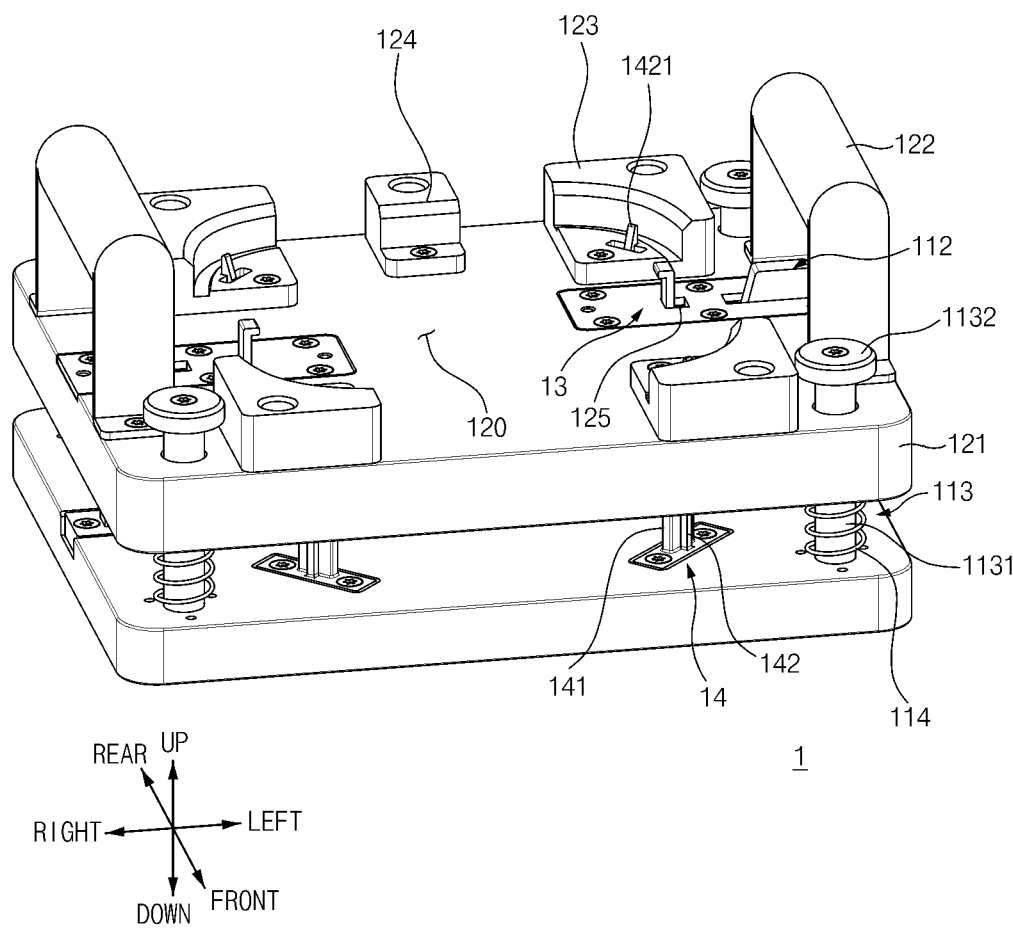
Figure 8:
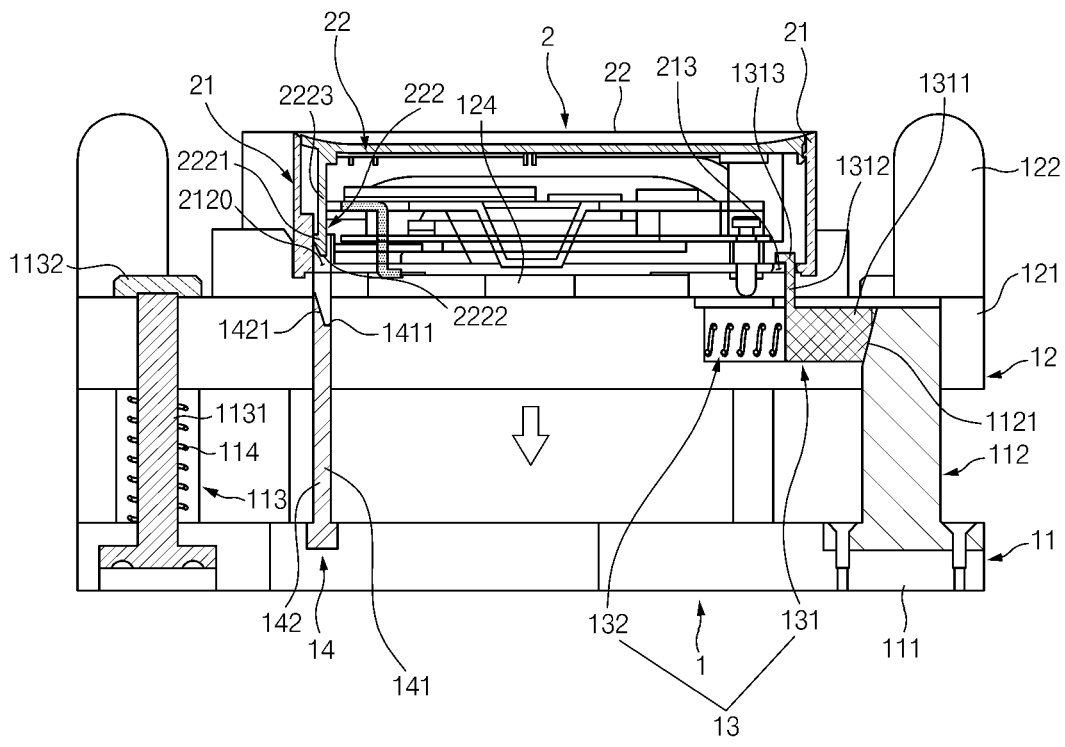
FIG. 8 is a longitudinal view of a disassembling apparatus in a first state according to an embodiment of the present disclosure.

FIGS. 6 and 7 are perspective views of the disassembling apparatus 1 according to an embodiment of the present disclosure. FIG. 8 is a longitudinal view of the disassembling apparatus 1 in a first state according to an embodiment of the present disclosure.

The disassembling apparatus 1 according to an embodiment of the present disclosure includes the base part 11, a movable part 12, a fixing part 13, and the separation part 14. Let's assume that a state, in which the movable part 12 is located farthest from a base block 111 when the electronic device 2 is seated on the movable part 12, is a first state and a state, in which the movable part 12 is located closest to the base block 111, is a second state.

The base part 11 includes the base block 111. The base block 111 is a block that directly contacts a ground surface or the like when the disassembling apparatus 1 is seated on the ground surface. Accordingly, the base block 111 may have a rectangular plate-shape that is perpendicular to the upward/downward direction such that the disassembling apparatus 1 is stably seated, but the shape is not limited thereto.

The base part 11 may further include a guide member 113. The guide member 113 may be coupled to the base block 111, and may pass through the movable part 12 such that the movable part 12 is guided. The guide member 113 may have a shape that extends upwards from an upper surface of the base block 111. A plurality of guide members 113 may be provided, and may be disposed at four corners of the base block 111, respectively, but the number and locations thereof are not limited thereto.

The guide member 113 may include a guide column 1131 that has a shape, such as a bolt, and is connected to the base block 111, and a guide head 1132 disposed at an upper end of the guide column 1131. A cross-section obtained by cutting the guide head 1132 by a plane that is perpendicular to the upward/downward direction may be larger than a cross-section of the guide column 1131. Accordingly, when the guide column 1131 passes through the movable part 12, the movable part 12 may be located on a lower side of the guide head 1132 and thus may be stopped by the guide head 1132 not to be separated upwards.

The base part 11 may further include a base elastic member 114. The base elastic member 114 is a component that is disposed between the movable part 12 and the base part 11 to elastically support the movable part 12 against the base block 111. The base elastic member 114 may be disposed to surround the guide column 1131. The first state may be a state, in which the base elastic member 114 is not deformed. Because the base elastic member 114 is disposed, the movable part 12 may return to the first state due to a restoring force due to elasticity of the base elastic member 114 when an external force is removed even when a location of the movable part 12 is changed from the first state to the second state by the external force. The number of base elastic members 114 may correspond to the number of the guide members 113, and may be disposed together with the guide members 113, respectively.

The base part 11 includes a pressing block 112. The pressing block 112 may be coupled to the base block 111, and may pass through the movable part 12. Accordingly, the pressing block 112 may have a shape that extends upwards from an upper surface of the base block 111. Because the pressing block 112 passes through the movable part 12, an upper end of the pressing block 112 may protrude upwards from the movable part 12 when the movable part 12 is moved toward the base block 111.

An upper portion of the pressing block 112 may have a shape, of which a cross-sectional area obtained by cutting it by a plane that is perpendicular to the upward/downward direction decreases as it goes toward an upper side. Accordingly, an upper inner surface 1121 that is a surface that is inclined with respect to the upward/downward direction may be formed at an upper portion of the pressing block 112. The upper inner surface 1121 may be disposed on an inside of the pressing block 112 with respect to a direction that is perpendicular to the upward/downward direction.

Disassembling Apparatus 1—Movable Part 12

The movable part 12 is a component that is configured such that the electronic device 2 is seated thereon and is coupled to the base part 11 to be moved relative to the base block 111. The movable part 12 is disposed to be spaced upwards apart from the base block 111.

The movable part 12 includes a movable block 121. The movable block 121 may have a rectangular plate-shape, but the shape thereof is not limited thereto.

The movable block 121 is a block, through which the pressing block 112 passes, to be moved relative to the pressing block 112. The guide member 113 and the separation part 14 may further pass through the movable block 121. Accordingly, a hole, into which the guide member 113 is inserted, may be formed in the movable block 121.

Accordingly, a hole, into which the separation part 14 is inserted, may be formed in the movable block 121.

A pressing block hole 126, into which the pressing block 112, may be formed in the movable block 121. A fixing member hole 125, into which the fixing member 131 is inserted, may be formed on an upper surface of the movable block 121. The hole, into which the guide member 113 is inserted, and the hole, into which the separation part 14 is inserted, as described above, may have shapes corresponding to a shape that is obtained by viewing the guide column 1131 in the upward/downward direction and a shape that is obtained by viewing the separation part 14. However, the fixing member hole 125 may be formed by a wide margin such that the fixing member 131 is moved in the fixing member hole 125 in a first direction that crosses the upward/downward direction. In the specification, the first direction is a leftward/rightward direction, but the direction is not limited thereto. The pressing block hole 126 may have a shape corresponding to a shape that is obtained by viewing the pressing block 112 in the upward/downward direction.

The movable block 121 may be formed through a scheme, in which an area, in which the fixing part 13 is embedded, is opened upwards and a cover, in which the above-described holes are formed, is covered after the fixing part 13 is located in the area such that the above-holes are formed and a portion of the fixing part 13 is located on an inside of the movable block 121.

Holders 123 and 124 that may hold the electronic device 2 may be disposed such that the electronic device 2 is seated on an upper surface of the movable block 121 and is disposed at a specific location. The holders 123 and 124 may have a recessed or protruding part such that the electronic device 2 is fixed thereto, and may allow the lower housing 21 to be inserted thereinto to be fixed. The electronic device 2 may be disposed and seated on a seating area 120 surrounded by the holders 123 and 124. A plurality of holders 123 and 124 may be disposed, and may be spaced apart from each other. The holders 123 and 124 may include the corner holder 123 that fixes corners of the electronic device 2, and the rear holder 124 that fixes a rear surface of the electronic device 2, in which terminals are disposed, but the numbers, kinds, and disposition thereof are not limited to the illustrated ones. The electronic device 2 may be seated on the holders 123 and 124 to be fixed at a location that is spaced upward apart from the movable block 121.

The movable part 12 may further include a gripper 122. The gripper 122 is a component that is configured such that an operator grips it and applies an external force to the movable part 12, and may be coupled to the movable block 121. It is illustrated in the drawings that two grippers 122 are disposed at opposite left and right ends of the movable block 121 one by one, but the locations are not limited thereto. The grippers 122 may include a plurality of portions that protrude upwards from the movable block 121, and portions that connect the protruding parts, and the shapes is not limited thereto.

Disassembling Apparatus 1—Fixing Part 13

The fixing part 13 is a component that is moved in conjunction with movement of the movable part 12 to attach and detach the lower housing 21 seated on the movable part 12 to and from the movable part 12. A portion of the fixing part 13 may be disposed in an interior of the movable block 121, and another portion thereof may protrude to an upper side of the movable block 121 through the fixing member hole 125. A plurality of fixing parts 13 may be provided, and as illustrated, may be disposed on left and right sides of the movable part 12 one by one, and locations, at which the two fixing parts 13 are disposed, may be different along the forward/rearward direction. That is, they are not disposed to be accurately symmetrical to each other, but may be disposed differently.

The fixing part 13 may include the fixing member 131. The fixing member 131 is a component including a part that protrudes to an upper side of the movable block 121 to be inserted into the electronic device 2, and may be moved along the first direction relative to the movable block 121. The fixing member 131 may be located on an inside of the pressing block 112 with respect to the first direction. In an embodiment of the present disclosure, because the fixing member 131 is located on an inside of the pressing block 112, the pressing block 112 may push the fixing member 131 to an inside with reference to the first direction when the movable part 12 is moved toward the base block 111, but the locational relationship may become opposite, and in this case, the pressing block 112 may push the fixing member 131 to an outside with respect to the first direction when the movable part 12 is moved toward the base block 111. Because the movable part 12 is located on an upper side of the base block 111, the movable part 12 may be lowered when the movable part 12 is moved toward the base block 111.

The fixing member 131 may include a fixed base piece 1311, a fixed column piece 1312, and a fixed stop piece 1313. The fixed base piece 1311 is a part that is embedded in the movable block 121, and at least a portion of an outer surface thereof located on an outside with respect to the first direction may be formed to be inclined with respect to the upward/downward direction. The outer surface may be inclined to an outside with respect to the first direction as it goes upwards.

As illustrated, a portion of a lower side of the outer surface of the fixed base piece 1311 may be inclined as described above, and a portion of an upper side thereof may be formed to face an outside. Accordingly, a lower side of the outer surface of the fixed base piece 1311 may function to move the fixing member 131 to an inside in a relationship with the upper inner surface 1121 of the pressing block 112, which will be described below, and an upper side of the outer surface may contact an inner surface of the remaining area of the pressing block 112 whereby the fixing member 131 may be prevented from being moved to an inside further after it is pressed to an inside to a specific location.

The above-described upper inner surface 1121 of the pressing block 112 of the base part 11 may be inclined to correspond to a shape of the outer surface of the fixed base piece 1311, and may contact the outer surface of the fixed base piece 1311 in the first state. Accordingly, when the movable part 12 is lowered, the pressing block 112 may push the fixing member 131 along the first direction.

The fixed column piece 1312 is a part that protrudes upwards from the fixed base piece 1311 and protrudes to an upper side of the movable block 121 through the fixing member hole 125. A shape obtained by viewing the fixed column piece 1312 along the upward/downward direction may be included in the shape of the fixing member hole 125. The fixing member hole 125 may be formed to be moved along the first direction in a state, in which the fixed column piece 1312 is inserted into the fixing member hole 125.

The fixed stop piece 1313 may be formed to protrude from an upper end of the fixed column piece 1312 along the first direction. The fixed stop piece 1313, as illustrated, may protrude inwards from the fixed column piece 1312 with respect to the first direction, but may protrude from the fixed column piece 1312 to an outside when the fixing member 131 is pushed to an outside when the movable part 12 is lowered as described above.

The fixed column piece 1312 and the fixed stop piece 1313 is inserted into the lower housing 21 through the fixing opening 213 when the electronic device 2 is seated on the movable part 12. The fixed stop piece 1313 may not be stopped by the lower housing 21 in the first state, and may be stopped by the lower housing 21 as the fixing member 131 is moved in the first direction when the movable part 12 is lowered. The fixed column piece 1312 contacts the inner surface of the lower housing 21 that defines the fixing opening 213 to press the lower housing 21 inwards, and the fixed stop piece 1313 is stopped by the upper surface of the lower housing 21, which is located on an inside. Because the lower housing 21 is gripped by the fixing member 131, a relative location of the lower housing 21 to the electronic device 2 is fixed.

The fixing part 13 may further include a fixing elastic member 132. The fixing part 13 may be embedded in the movable block 121. The fixing elastic member 132 may be disposed between the movable part 12 and the fixing member 131. The fixing elastic member 132 may be disposed on an inside of the fixing member 131 with respect to the first direction.

The fixing elastic member 132 may elastically support the fixing member 131 along the first direction against the movable part 12 such that the fixing member 131 returns to a location, at which the gripping of the lower housing 21 is released. The fixing elastic member 132 may be a state, in which it is not deformed, in the first state, and the movable part 12 may be compressed between the movable block 121 and the fixing member 131 when the fixing member 131 is pushed to an inside with respect to the first direction by the pressing block 112 that is lowered or raised by an external force. When the external force to the movable part 12 disappears, the pressing block 112 may be lowered while the movable part 12 is raised by the base elastic member 114, and the compression of the fixing elastic member 132 may also be stopped to be return as a restoring force due to elasticity acts on the fixing member 131 to an outside with respect to the first direction.

Disassembling Apparatus 1—Separation Part 14

The separation part 14 is a component that is inserted into an interior of the electronic device 2 through movement of the movable part 12 to separate the upper housing 22 and the lower housing 21. The separation part 14 does not press the upper housing 22 to an upper side in the first state, but protrudes to an upper side of the movable part 12 and presses the upper housing 22 to an upper side through the coupling opening 2120 to separate the lower housing 21 fixed to the movable part 12 by using the fixing member 131.

The separation part 14 may be coupled to the base block 111. The separation part 14 may have a shape that extends upwards from the upper surface of the base block 111. The separation part 14 may pass through movable block 121. The separation part 14 may be inserted into the coupling opening 2120 because it also protrudes on an upper side of the movable part 12 in the first state, but may not have a portion that protrudes on an upper side of the movable part 12 in the first state.

The separation part 14 may include the inclined separation member 142 and a separation/pressing member 141. The inclined separation member 142 may be inserted into the lower insertion hole 2122. The inclined separation member 142 may have an upper end 1421, at which an outer surface that is inclined with respect to the upward/downward direction is formed. The outer surface at the upper end 1421 of the inclined separation member 142 may have a shape corresponding to the inclined outer surface of the upper coupling head 2221 to contact the outer surface of the upper coupling head 2221. Accordingly, when the inclined separation member 142 is inserted into the coupling opening 2120 from a lower side of the lower housing 21 to an upper side, it may contact the outer surface of the upper coupling head 2221, and the upper end 1421 of the inclined separation member 142 may push the upper coupling head 2221 to an inside while the separation part 14 is raised. The inclined separation member 142 may continue to be inserted into the lower housing 21 while passing through the lower insertion hole 2122.

The separation/pressing member 141 may have an upper surface 1411 that faces an upper side on a lower side of an upper side of the inclined separation member 142. When the separation/pressing member 141 is inserted into the coupling opening 2120, an upper surface 1411 thereof contacts the head surface 2222 of the upper coupling head 2221, and thus it may function to push the upper coupling head 2221 to an upper side. The separation/pressing member 141 may be disposed on an inner side of the inclined separation member 142.

Figure 9:
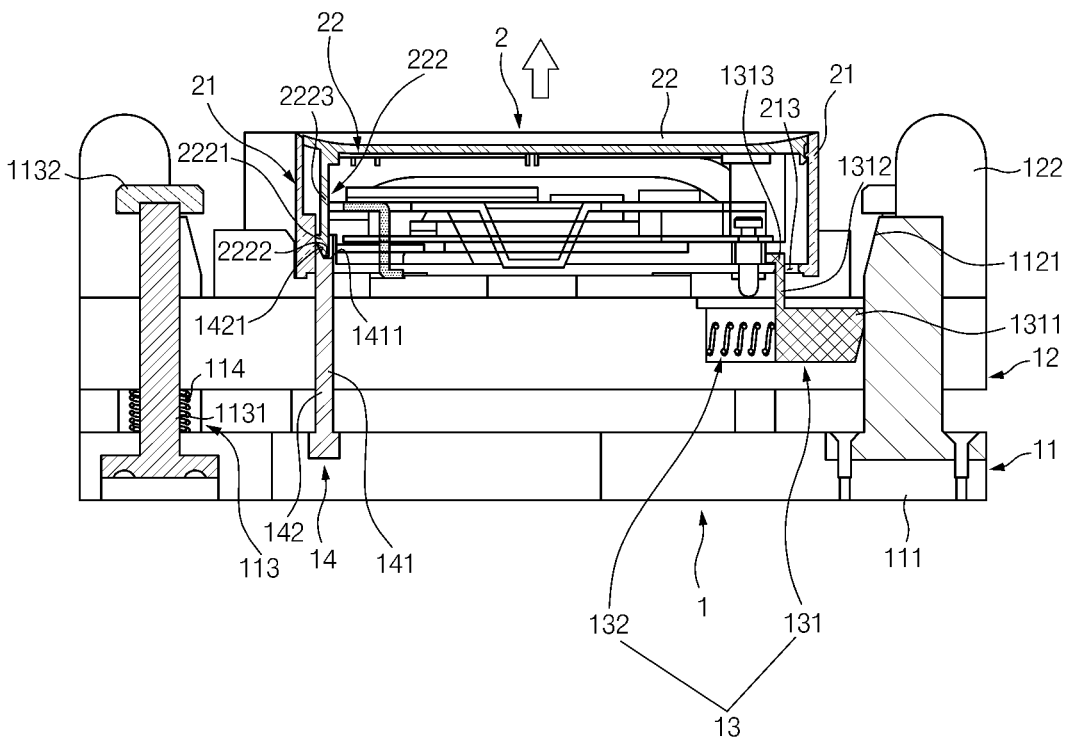
FIG. 9 is a longitudinal view of a disassembling apparatus in a second state according to an embodiment of the present disclosure.
Figure 10:
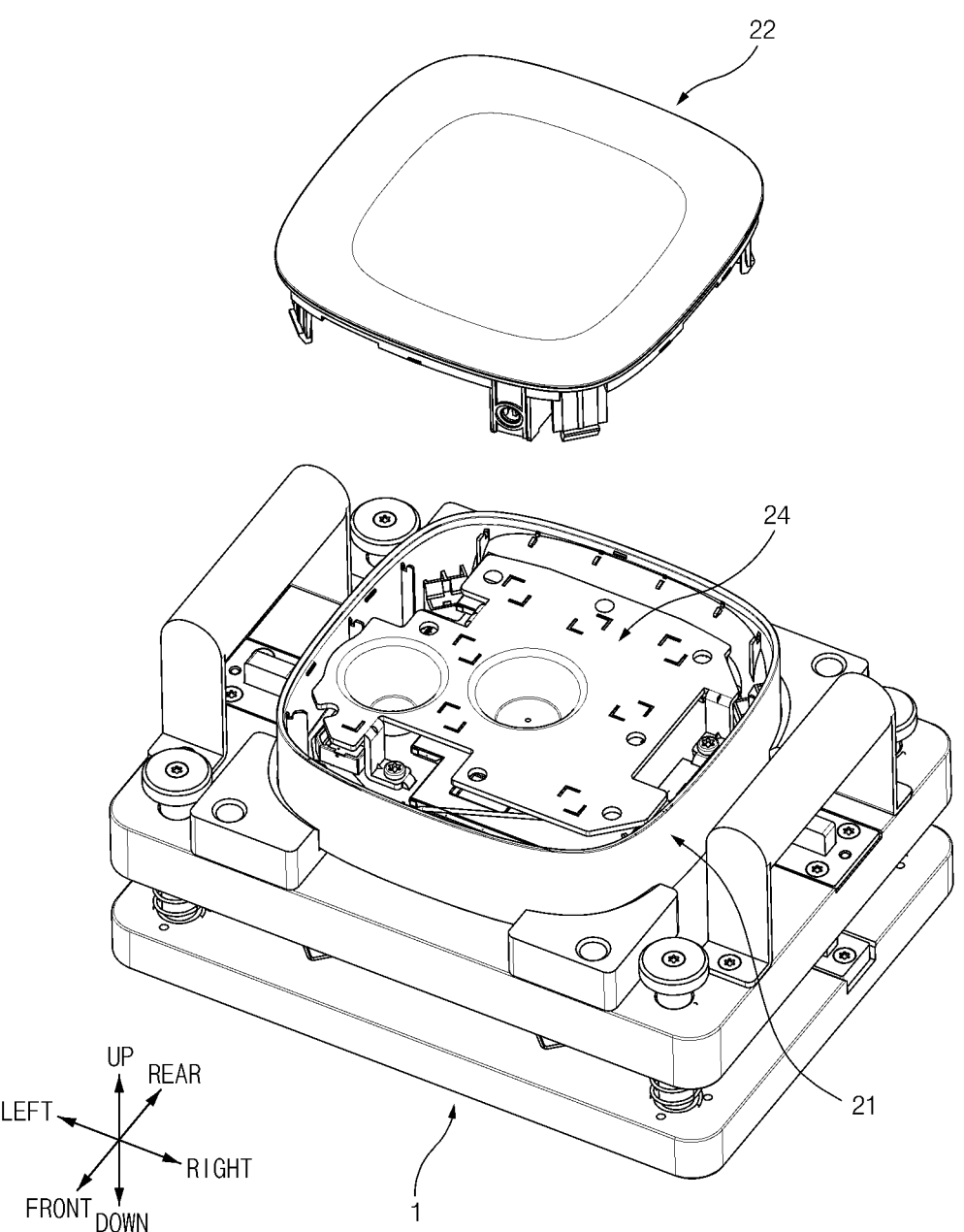
FIG. 10 is a perspective view illustrating a situation, in which an upper housing of an electronic device is separated by using a disassembling apparatus according to an embodiment of the present disclosure.

FIG. 9 is a longitudinal view of the disassembling apparatus 1 in the second state according to an embodiment of the present disclosure. FIG. 10 is a perspective view illustrating a situation, in which the upper housing 22 of the electronic device 2 is separated by using the disassembling apparatus 1 according to an embodiment of the present disclosure.

When the electronic device 2 is seated on the movable part 12 and is in the first state, the movable part 12 may be transited to the second state by an external force applied to the gripper 122 by an operator. When the movable part 12 is lowered, as described above, the pressing block 112 may push the fixing member 131 to an inside whereby the lower housing 21 is fixed to the movable part 12.

At the same time, the separation part 14 is inserted upwards into the lower housing 21 through the coupling opening 2120. Because the inclined separation member 142 pushes the upper coupling head 2221 to an inside and the separation/pressing member 141 pushes the head surface 2222 to an upper side, the upper coupling head 2221 stopped by the lower coupling part 212 may be separated from the lower coupling part 212.

The separation part 14 also is raised and pushes the upper housing 22 to an upper side after the upper coupling head 2221 is separated from the lower coupling part 212, but because the lower housing 21 is fixed to the movable part 12 by the fixing member 131, the upper housing 22 may be separated from the lower housing 21. That is, the upper housing 22 and the lower housing 21 also may be disassembled through a simple operation of pressing the movable part 12 by applying an external force.

Although it may have been described until now that all the components constituting the embodiments of the present disclosure are coupled to one or coupled to be operated, the present disclosure is not essentially limited to the embodiments. That is, without departing from the purpose of the present disclosure, all the components may be selectively coupled into one or more components to be operated. Furthermore, because the terms, such as "comprising", "including", or "having" may mean that the corresponding component may be included unless there is an especially contradictory description, it should be construed that another component is not extruded but may be further included. In addition, unless defined otherwise, all terms used herein, including technical or scientific terms, have the same meanings as those generally understood by those skilled in the art to which the present disclosure pertains. The terms, such as the terms defined in dictionaries, which are generally used, should be construed to coincide with the context meanings of the related technologies, and are not construed as ideal or excessively formal meanings unless explicitly defined in the present disclosure.

The above description is a simple exemplification of the technical spirits of the present disclosure, and the present disclosure may be variously corrected and modified by those skilled in the art to which the present disclosure pertains without departing from the essential features of the present disclosure. Accordingly, the embodiments disclosed in the present disclosure is not provided to limit the technical spirits of the present disclosure but provided to describe the present disclosure, and the scope of the technical spirits of the present disclosure is not limited by the embodiments. Accordingly, the technical scope of the present disclosure should be construed by the attached claims, and all the technical spirits within the equivalent ranges fall within the scope of the present disclosure.

What is claimed is:

1. A disassembling apparatus comprising:

a base part including a base block;

a movable part configured such that an electronic device comprising an upper housing and a lower housing coupled to each other is disposed with the lower housing seated on the movable part to be spaced upwards apart from the base block, and the movable part is coupled to the base block to be moved relative to the base block;

a fixing part coupled to the movable part and configured to attach or detach the lower housing seated on the movable part to or from the movable part; and a separation part coupled to the base block, the separation part being configured to be inserted into an interior of the electronic device through the movement of the movable part toward the base block to separate the upper housing and the lower housing.

2. The disassembling apparatus of claim 1, wherein the base part further includes a guide member coupled to the base block and configured to pass through the movable part such that the movable part is guided.

3. The disassembling apparatus of claim 1, wherein the base part further includes a base elastic member disposed between the movable part and the base block and configured to elastically support the movable part against the base block.

4. The disassembling apparatus of claim 1, wherein the base part includes a pressing block coupled to the base block and configured to pass through the movable part, and an upper end of the pressing block protrudes upwards from the movable part when the movable part is moved toward the base block, and wherein the fixing part includes a fixing member configured to be inserted into the electronic device and configured to be moved by the pressing block along a first direction that is a direction that crosses an upward/downward direction to grip the lower housing when the movable part is moved toward the base block.

5. The disassembling apparatus of claim 4, wherein the pressing block has an upper inner surface that is a surface that is inclined with respect to the upward/downward direction is formed on an upper side of the pressing block, wherein the fixing member has an outer surface that is inclined with respect to the upward/downward direction, and wherein the upper inner surface of the pressing block and the outer surface of the fixing member are configured to contact each other in a state in which the movable part is furthest spaced apart from the base block, and the pressing block is configured to push the fixing member in the first direction when the movable part is lowered.

6. The disassembling apparatus of claim 4, wherein the fixing member is configured to be inserted into a fixing opening formed in the lower housing, and configured to press an inner surface of the lower housing that defines the fixing opening along the first direction when the movable part is moved toward the base block.

7. The disassembling apparatus of claim 4, wherein the fixing part further includes a fixing elastic member disposed between the movable part and the fixing member, wherein the fixing elastic member is configured to elastically support the fixing member along the first direction against the movable part such that the fixing member returns to a location at which the lower housing is released from the gripping.

8. The disassembling apparatus of claim 1, wherein when a state in which the movable part is located farthest from the base block is defined as a first state and a state in which the movable part is located closest to the base block is defined as a second state when the electronic device is seated on the movable part, the separation part coupled to the base block is configured to not press the upper housing upwards in the first state, and the separation part is configured to protrude upwards from the movable part to pressure the upper housing upwards as the movable part is moved toward the base block in the second state such that the upper housing is separated from the lower housing.

9. The disassembling apparatus of claim 8, wherein the separation part further includes:

an inclined separation member, an upper side of which has an outer surface that is inclined with respect to the upward/downward direction; and a separation/pressing member, an upper surface of which faces an upper side from a side that is lower than an upper side of the inclined separation member.

\* \* \* \* \*